US007623557B2

(12) United States Patent
Tokuhisa et al.

(10) Patent No.: US 7,623,557 B2
(45) Date of Patent: Nov. 24, 2009

(54) WAVELENGTH CONVERTING OPTICAL SYSTEM, LASER LIGHT SOURCE, EXPOSURE APPARATUS, MASK EXAMINING APPARATUS, AND MACROMOLECULAR CRYSTAL LENS MACHINING DEVICE

(75) Inventors: Akira Tokuhisa, Tokyo (JP); Hitoshi Kawai, Tokyo (JP); Yoshinori Oshita, Tokyo (JP)

(73) Assignee: Nikon Corporation, Tokyo (JP)

( * ) Notice: Subject to any disclaimer, the term of this patent is extended or adjusted under 35 U.S.C. 154(b) by 332 days.

(21) Appl. No.: 11/602,366

(22) Filed: Nov. 20, 2006

(65) Prior Publication Data

US 2007/0177639 A1 Aug. 2, 2007

Related U.S. Application Data

(63) Continuation-in-part of application No. PCT/JP2005/010087, filed on May 26, 2005.

(30) Foreign Application Priority Data

May 26, 2004 (JP) ............................ 2004-155401
Jan. 7, 2005 (JP) ............................ 2005-002534

(51) Int. Cl.
*H01S 3/10* (2006.01)

(52) U.S. Cl. ............................ 372/22; 372/20; 372/21

(58) Field of Classification Search .................. 372/21, 372/22, 23
See application file for complete search history.

(56) References Cited

U.S. PATENT DOCUMENTS 5,710,134 A 1/1998 Bosslet et al.
(Continued)

FOREIGN PATENT DOCUMENTS

JP 07-122483 A 5/1995
(Continued)

OTHER PUBLICATIONS

Computer-generated English language Abstracts are provided.
(Continued)

*Primary Examiner*—Dung T Nguyen
(74) *Attorney, Agent, or Firm*—Frishauf, Holtz, Goodman & Chick, P.C.

(57) ABSTRACT

A fifth harmonic wave is formed from a fundamental wave of p-polarized light via a second harmonic wave forming optical element 3, a third harmonic wave forming optical element 4, and a fifth harmonic wave forming optical element 6 and a second harmonic wave of p-polarized light is formed from a fundamental wave of s-polarized light by a second harmonic wave forming optical element 9. The fifth harmonic wave of p-polarized light that is subjected to beam shaping by cylindrical lenses 7 and 8, the fundamental wave of s-polarized light, and the second harmonic wave of p-polarized light are combined by a dichroic mirror 10, and are incident on a seventh harmonic wave forming optical element 11. Furthermore, a seventh harmonic wave of s-polarized light is formed from the second harmonic wave and fifth harmonic wave of p-polarized light, and this seventh harmonic wave is mixed with the fundamental wave of s-polarized light in an eighth harmonic wave forming optical element 12, so that an eighth harmonic wave of p-polarized light is formed. As a result, an eighth harmonic wave can be formed in a simpler optical system than a conventional optical system.

11 Claims, 11 Drawing Sheets

U.S. PATENT DOCUMENTS 7,136,402 B1 11/2006 Ohtsuki
7,339,961 B2 * 3/2008 Tokuhisa et al. .............. 372/22

FOREIGN PATENT DOCUMENTS

JP 09-192875 A 7/1997
JP 10-339891 A 12/1998
JP 11-015034 A 1/1999
JP 2001-353176 A 12/2001
JP 2004-061915 A 2/2004
JP 2006-308908 * 11/2006
WO WO 01/20397 A1 3/2001

OTHER PUBLICATIONS

Commercially-available English language Abstracts are provided.

* cited by examiner

F i g . 6
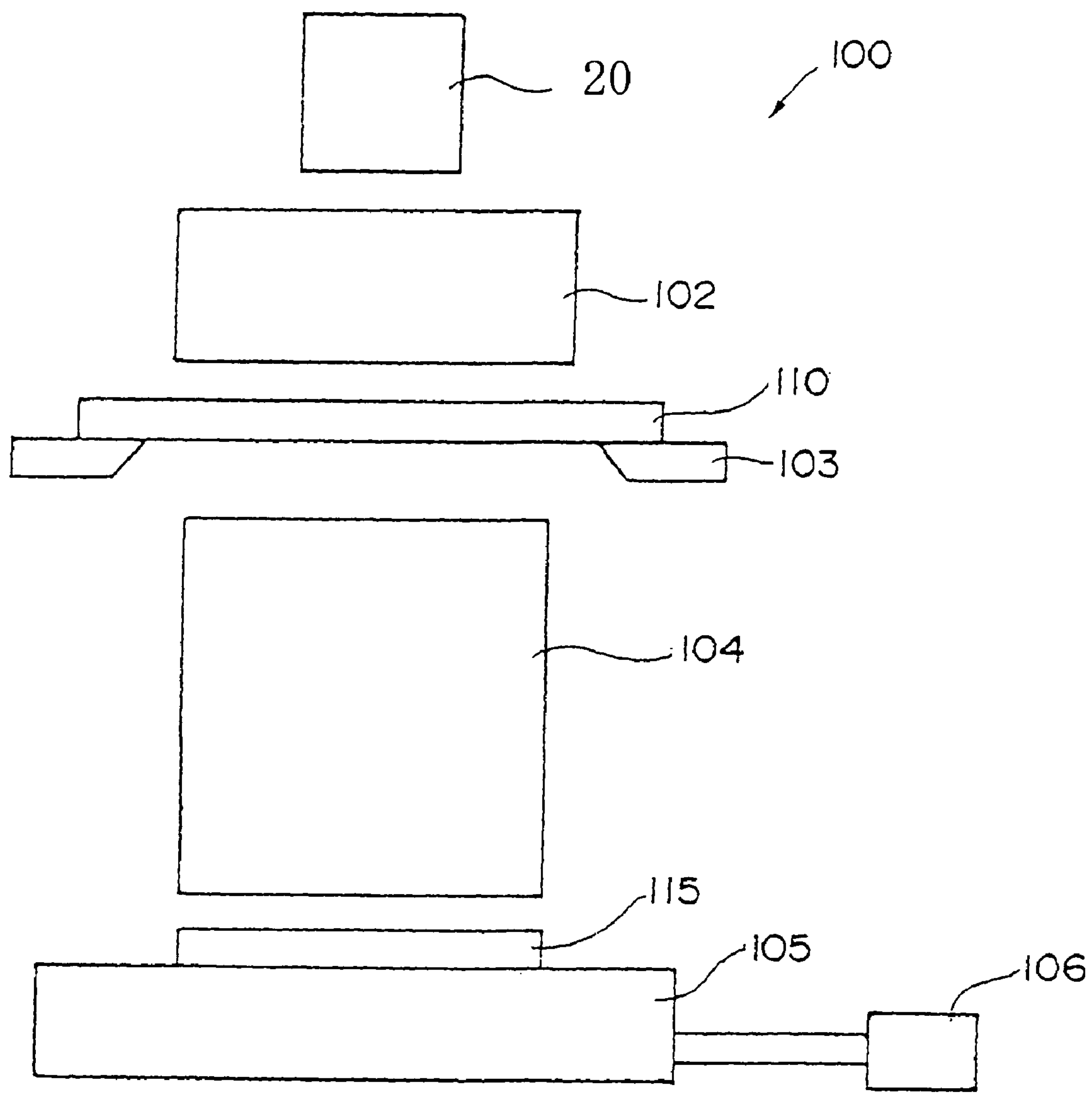

WAVELENGTH CONVERTING OPTICAL SYSTEM, LASER LIGHT SOURCE, EXPOSURE APPARATUS, MASK EXAMINING APPARATUS, AND MACROMOLECULAR CRYSTAL LENS MACHINING DEVICE

This is a continuation in-part from PCT International Application No. PCT/JP2005/010087 filed on May 26, 2005, which is hereby incorporated.

TECHNICAL FIELD

The present invention relates to a wavelength converting optical system which generates an eighth harmonic wave from semiconductor laser light mainly having long wavelength (light having a frequency that is n times that of the fundamental wave is referred to as an n-th harmonic wave), a laser light source using this optical system, and an exposure apparatus, mask inspection device and macromolecular crystal working apparatus utilizing this laser light source.

BACKGROUND ART

In recent years, laser light has been used in various applications; for example, laser light has been used in the cutting and working of metals, and as a light source in photolithographic devices used in semiconductor manufacturing apparatuses. Furthermore, laser light has been used in various types of measuring instruments, and in operations and treatment devices used in surgery, ophthalmology, dentistry, and the like.

However, in the case of ArF excimer laser oscillators, the oscillators are constructed with argon gas, fluorine gas, neon gas, and the like sealed inside the chamber, and these gases must be tightly sealed. Furthermore, since these respective gases must also be loaded into the apparatus and recovered, there is a problem in that the apparatus tends to become large in size and complicated. Moreover, in order to maintain a specified laser light generating performance in an ArF excimer laser oscillator, the internal gases must be periodically replaced, or the apparatus must be periodically overhauled.

Accordingly, it is desirable to use a solid-state laser as a laser light source instead of such an excimer laser. However, the wavelength of the laser light that is emitted from a solid-state laser ranges from the visible region to the infrared region; therefore, this wavelength is too long to be suitable for use, for example, in an inspection device. Accordingly, a method has been developed in which long-wavelength light emitted from such a solid-state laser is used after being converted into short-wavelength ultraviolet light (e.g., an eighth harmonic wave) using nonlinear optical crystals. For example, such a method is described in Japanese Patent Application Laid-Open No. 2001-353176.

An outline of the optical system of such a laser apparatus is shown in FIG. 10. In this figure, the objects indicated by oval shapes are collimator lenses and focusing lenses; a description of these lenses is omitted. Furthermore, p-polarized light is indicated by an arrow symbol, s-polarized light is indicated by symbols showing a dot inside a circle, the fundamental wave is indicated by ω, and n-th harmonic waves are indicated by nω. In this example, fundamental light (wavelength: 1547 nm) emitted from a DFB laser (not shown in the figure) is amplified by an EDFA 51 and converted into p-polarized light, and is then caused to be incident on a second harmonic wave forming optical element (PPLN crystal) 52. A second harmonic wave of p-polarized light is generated from the second harmonic wave forming optical element 52 along with the fundamental wave.

This fundamental wave and second harmonic wave are caused to be incident on a triple wave forming optical element (LBO crystal) 53. A triple wave of s-polarized light is generated along with the fundamental wave and second harmonic wave from the triple wave forming optical element 53. This light is caused to pass through a dichroic mirror 54, so that the light is separated into the fundamental wave and the second harmonic wave/third harmonic wave.

The separated second harmonic wave/third harmonic wave passes through a 2-wavelength waveplate 55; in this case, the second harmonic wave is converted into s-polarized light. The second harmonic wave and third harmonic wave that have both become s-polarized light are caused to be incident on a fifth harmonic wave forming optical element (LBO crystal) 56. A fifth harmonic wave of p-polarized light is generated from the fifth harmonic wave forming optical element 56 along with the second harmonic wave and third harmonic wave.

The second harmonic wave, third harmonic wave and fifth harmonic wave are caused to pass through a dichroic mirror 57, so that the second harmonic wave and fifth harmonic wave are separated. The separated fifth harmonic wave is reflected by a mirror 58, and is subjected to beam shaping by cylindrical lenses 59 and 60. Generally, because of walk-off, the fifth harmonic wave generated from the fifth harmonic wave forming optical element 56 has an elliptical cross-sectional shape, so that the focusing characteristics are poor “as is,” and the wave cannot be used in the next wavelength conversion. Accordingly, this elliptical cross-sectional shape is shaped into a circular shape by the cylindrical lenses 59 and 60.

The second harmonic wave separated by the dichroic mirror 57 is converted into p-polarized light by passing through a ½-waveplate 61, and is reflected by a mirror 62. This light is then placed on the same optical path as the fifth harmonic wave described above by a dichroic mirror 63. The dichroic mirror 63 is a mirror that allows the second harmonic wave to pass through, but reflects the fifth harmonic wave. This second harmonic wave and fifth harmonic wave are caused to be incident on a seventh harmonic wave forming optical element (CLBO crystal) 64. A seventh harmonic wave of s-polarized light is generated from the seventh harmonic wave forming optical element 64 along with the second harmonic wave and fifth harmonic wave. Because of walk-off, this seventh harmonic wave also has an elliptical cross-sectional shape, and therefore has poor focusing characteristics “as is,” so that this wave cannot be used in the next wavelength conversion. Accordingly, this elliptical cross-sectional shape is shaped into a circular shape by means of cylindrical lenses 65 and 66.

Meanwhile, the fundamental wave separated by the dichroic mirror 54 is reflected by a mirror 67, and is converted into s-polarized light by passing through a ½-waveplate 68. This light is then placed on the same optical path as the seventh harmonic wave by a dichroic mirror 69. The dichroic mirror 69 is a mirror that allows the fundamental wave to pass through, and reflects the seventh harmonic wave.

This fundamental wave and seventh harmonic wave are caused to be incident on an eighth harmonic wave forming optical element (CLBO crystal) 70. An eighth harmonic wave of p-polarized light is generated from the eighth harmonic wave forming optical element 70 along with the fundamental wave and seventh harmonic wave.

However, in the optical system shown in FIG. 10, the following problems arise: namely, the optical elements that are used are numerous and complicated; furthermore, a dichroic mirror 69 used to combine the fundamental wave and seventh harmonic wave is required. In cases where an eighth harmonic wave with a wavelength of 193 nm is formed, the wavelength of the seventh harmonic wave is 221 nm. In the case of such deep ultraviolet light, general dichroic mirrors show problems in terms of durability. Moreover, an adjustment is needed for the purpose of superimposing the fundamental wave and seventh harmonic wave by means of the dichroic mirror 69, and this work is difficult.

DISCLOSURE OF THE INVENTION

The present invention was devised in light of such circumstances; it is an object of the present invention to provide a wavelength converting optical system which can form an eighth harmonic wave in an optical system that is simpler than a conventional optical system, a wavelength converting optical system which also eliminates the need for superimposition of the fundamental wave and seventh harmonic wave, a laser light source using these wavelength converting optical systems, and an exposure apparatus, mask inspection device and polymer crystal working apparatus using this laser light source.

The first invention used to achieve the object described above is a wavelength converting optical system comprising: a first second harmonic wave forming optical element which forms a first second harmonic wave from a first fundamental wave; a third harmonic wave forming optical element which forms a third harmonic wave from the first fundamental wave and the second harmonic wave that are emitted from the first second harmonic wave forming optical element; a fifth harmonic wave forming optical element which forms a fifth harmonic wave from the second harmonic wave and the third harmonic wave that are emitted from the third harmonic wave forming optical element; a second harmonic wave forming optical element which forms a second harmonic wave from a second fundamental wave; an optical member which combines on the same optical path the second fundamental wave and the second harmonic wave that are emitted from the second harmonic wave forming optical element with the fifth harmonic wave that is emitted from the fifth harmonic wave forming optical element; a seventh harmonic wave forming optical element which forms a seventh harmonic wave from the second harmonic wave and the fifth harmonic wave; and an eighth harmonic wave forming optical element which forms an eighth harmonic wave from the second fundamental wave and the seventh harmonic wave that are emitted from the seventh harmonic wave forming optical element.

The second invention used to achieve the object described above is a wavelength converting optical system comprising: a first wavelength converting optical system which forms a fifth harmonic wave from a first fundamental wave via at least one wavelength converting optical element; a second harmonic wave forming optical element which forms a second harmonic wave from a second fundamental wave; an optical member which combines on the same optical path the second fundamental wave and the second harmonic wave that are emitted from the second harmonic wave forming optical element with the fifth harmonic wave that is emitted from the first wavelength converting optical system; a seventh harmonic wave forming optical element which forms a seventh harmonic wave from the second harmonic wave and the fifth harmonic wave; and an eighth harmonic wave forming optical element which forms an eighth harmonic wave from the second fundamental wave and the seventh harmonic wave that are emitted from the seventh harmonic wave forming optical element.

The third invention used to achieve the object described above is wavelength converting optical system comprising: a first optical member which splits a fundamental wave into a first fundamental wave and a second fundamental wave; a first second harmonic wave forming optical element which forms a first second harmonic wave from the first fundamental wave; a third harmonic wave forming optical element which forms a third harmonic wave from the first fundamental wave and the first second harmonic wave that are emitted from the first second harmonic wave forming optical element; a fifth harmonic wave forming optical element which forms a fifth harmonic wave from the first second harmonic wave and the third harmonic wave that are emitted from the third harmonic wave forming optical element; a second harmonic wave forming optical element which forms a second harmonic wave from the second fundamental wave; a second optical member which combines on the same optical path the second fundamental wave and the second harmonic wave that are emitted from the second harmonic wave forming optical element with the fifth harmonic wave that is emitted from the fifth harmonic wave forming optical element; a seventh harmonic wave forming optical element which forms a seventh harmonic wave from the second harmonic wave and the fifth harmonic wave; and an eighth harmonic wave forming optical element which forms an eighth harmonic wave from the second fundamental wave and the seventh harmonic wave that are emitted from the seventh harmonic wave forming optical element.

The fourth invention used to achieve the object described above is a wavelength converting optical system comprising: a second harmonic wave forming optical element which forms a second harmonic wave from a fundamental wave; a third harmonic wave forming optical element which forms a third harmonic wave from the fundamental wave and the second harmonic wave that are emitted from the second harmonic wave forming optical element; a fifth harmonic wave forming optical element which forms a fifth harmonic wave from the second harmonic wave and the third harmonic wave that are emitted from the third harmonic wave forming optical element; a seventh harmonic wave forming optical element which forms a seventh harmonic wave from the second harmonic wave and the fifth harmonic wave that are emitted from the fifth harmonic wave forming optical element; and an eighth harmonic wave forming optical element which forms an eighth harmonic wave from the fundamental wave and the seventh harmonic wave that are emitted from the seventh harmonic wave forming optical element.

The fifth invention used to achieve the object described above is any of the first through fourth inventions, wherein the length of the seventh harmonic wave forming optical element is 3 to 10 mm, and the beam diameter of the light that is incident on the seventh harmonic wave forming optical element is 100 to 300 μm.

The sixth invention used to achieve the object described above is the fifth invention, wherein there is no focusing optical system between the seventh harmonic wave forming optical element and the eighth harmonic wave forming optical element.

The seventh invention used to achieve the object described above is a wavelength converting optical system comprising: a first second harmonic wave forming optical element which forms a first second harmonic wave from a first fundamental wave; a third harmonic wave forming optical element which forms a third harmonic wave from the first fundamental wave and the first second harmonic wave that are emitted from the first second harmonic wave forming optical element; a fifth harmonic wave forming optical element which forms a fifth harmonic wave from the first second harmonic wave and the third harmonic wave that are emitted from the third harmonic wave forming optical element; a second harmonic wave forming optical element which forms a second harmonic wave from a second fundamental wave; a first optical member which separates the second fundamental wave and the second harmonic wave that are emitted from the second harmonic wave forming optical element; a second optical member which combines on the same optical path the second harmonic wave with the fifth harmonic wave that is emitted from the fifth harmonic wave forming optical element; a seventh harmonic wave forming optical element which forms a seventh harmonic wave from the fifth harmonic wave and the second harmonic wave; a third optical member which combines on the same optical path the second fundamental wave with the seventh harmonic wave that is emitted from the seventh harmonic wave forming optical element; and an eighth harmonic wave forming optical element which forms an eighth harmonic wave from the second fundamental wave and the seventh harmonic wave.

The eighth invention used to achieve the object described above is a laser light source comprising the wavelength converting optical system according any of the first through seventh inventions.

The ninth invention used to achieve the object described above is an exposure apparatus which is constructed so that this exposure apparatus comprises: the laser light source according to the eighth invention; a mask supporting part which holds a photo-mask on which a specified exposure pattern is formed; an object holding part which holds the object of exposure; an illumination optical system which illuminates the photo-mask held by the mask supporting part with ultraviolet light emitted from the laser light source; and a projection optical system which illuminates the object of exposure held by the object holding part with illuminating light that is caused to illuminate the photo-mask via the illumination optical system and that passes through this photo-mask.

The tenth invention used to achieve the object described above is a mask defect inspection device comprising: the laser light source according to the eighth invention; a mask supporting part which holds a photo-mask on which a specified pattern is formed; a detector which detects a projected image of the pattern; an illumination optical system which illuminates the photo-mask held by the mask supporting part with ultraviolet light emitted from the laser light source; and a projection optical system which projects onto the detector illuminating light that has been caused to illuminate the photo-mask via the illumination optical system and that has passed through this photo-mask.

The eleventh invention used to achieve the object described above is a polymer crystal working apparatus, comprising: the laser light source according to the eighth invention; an optical system which conducts laser light emitted from this laser light source to a polymer crystal that constitutes the object of working, and focuses this light on the portion of this polymer crystal that is being worked; and a mechanism which varies the relative positions of the optical system and the polymer crystal.

BRIEF DESCRIPTION OF THE DRAWINGS

FIG. 6 is a diagram showing an outline of an exposure apparatus using a laser apparatus constituting a working configuration of the present invention.

BEST MODE FOR CARRYING OUT THE INVENTION

Figure 1:
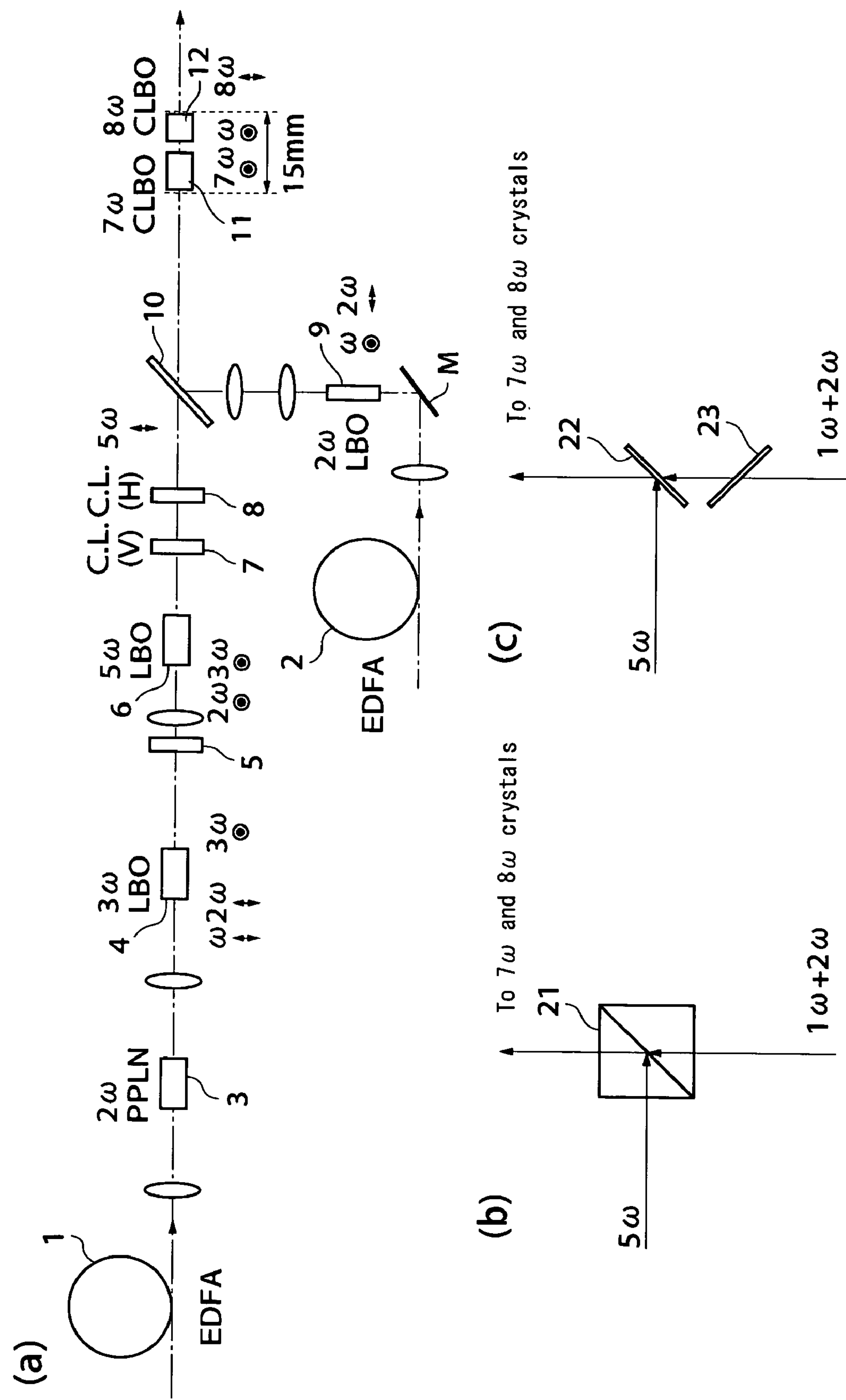
FIG. 1 is a diagram showing an outline of the optical system of a laser apparatus constituting a first working configuration of the present invention.

Working configurations of the present invention will be described below using the figures. FIG. 1 is a diagram showing an outline of the optical system of a laser apparatus constituting a first working configuration of the present invention. In FIGS. 1, 3, 4 and 5, the objects indicated by oval shapes are collimator lenses and focusing lenses; an explanation of these lenses is omitted. Furthermore, p-polarized light is indicated by an arrow symbol, s-polarized light is indicated by symbols showing a dot inside a circle, the fundamental wave is indicated by ω, and n-th waves are indicated by nω.

This working configuration is characterized in that the fundamental wave (wavelength: 1547 nm) that is emitted from a DFB laser (not shown in the figures) is amplified by a first EDFA 1 and a second EDFA 2. However, it would also be possible to use the light amplified by a single EDFA by causing this light to branch into two types of light, i.e., p-polarized light and s-polarized light, by means of a polarizing beam splitter.

As is shown in FIG. 1(*a*), the fundamental wave of p-polarized light that is amplified by the first EDFA 1 is caused to be incident on the first second harmonic wave forming optical element (PPLN crystal) 3, and a second harmonic wave of p-polarized light is generated along with the fundamental wave from the first second harmonic wave forming optical element 3. This fundamental wave and second harmonic wave are caused to be incident on the third harmonic wave forming optical element (LBO crystal) 4. A third harmonic wave of s-polarized light is generated along with the fundamental wave and second harmonic wave from the third harmonic wave forming optical element 4. Furthermore, the second harmonic wave forming optical element 3 is not limited to a PPLN crystal; it would also be possible to use a BBO crystal, LBO crystal, CBO crystal, CLBO crystal, AANP crystal, or the like.

As a result of these light beams being passed through the 2-wavelength waveplate 5, only the second harmonic wave is converted into s-polarized light. For example, a waveplate consisting of a flat plate of a uniaxial crystal that is cut parallel to the optical axis of the crystal can be used as the 2-wavelength waveplate. The thickness of the waveplate (crystal) is cut at an integral multiple of $\lambda/2$ with respect to the light of one wavelength (second harmonic wave), and is cut at an integral multiple of $\lambda$ with respect to the light of the other wavelength, so that the polarization is rotated with respect to the light of one wavelength, and so that the polarization is not rotated with respect to the light of the other wavelength. Moreover, the second harmonic wave and third harmonic wave that have both become s-polarized light are caused to be incident on the fifth harmonic wave forming optical element (LBO crystal) 6. A fifth harmonic wave of p-polarized light is generated along with the second harmonic wave and third harmonic wave from the fifth harmonic wave forming optical element 6. Furthermore, the fundamental wave of p-polarized light passes through the fifth harmonic wave forming optical element 6 "as is."

The fifth harmonic wave that is generated from the fifth harmonic wave forming optical element 6 has an elliptical cross-sectional shape because of walk-off; accordingly, this wave has poor focusing characteristics "as is," and cannot be used in the next wavelength conversion. Consequently, this elliptical cross-sectional shape is shaped into a circular shape by the cylindrical lenses 7 and 8. Furthermore, a BBO crystal or CBO crystal may also be used as the fifth harmonic wave forming optical element 6.

Meanwhile, the fundamental wave of s-polarized light that is amplified by the second EDFA 2 is incident on the second harmonic wave forming optical element (LBO crystal) 9 via a mirror M (the mirror M is not absolutely necessary), and a second harmonic wave of p-polarized light is generated along with the fundamental wave from the second harmonic wave forming optical element 9. Furthermore, it would also be possible to use a PPLN crystal of ooe conversion, instead of a LBO crystal. This fundamental wave and second harmonic wave are combined with the fifth harmonic wave of p-polarized light mentioned above by the dichroic mirror 10. In this example, the dichroic mirror 10 is a mirror that reflects the fundamental wave and second harmonic wave, but allows the fifth harmonic wave to pass through. It would also be possible to use a bulk type optical element for this mixing of light; for example, it would also be possible to use a color separation/synthesizing mirror (dichroic mirror), or to use a reflective type or transmitting type diffraction optical element.

The combined fundamental wave of s-polarized light, second harmonic wave of p-polarized light and fifth harmonic wave of p-polarized light are caused to be incident on the seventh harmonic wave forming optical element (CLBO crystal) 11, and a seventh harmonic wave of s-polarized light is generated along with these incident light beams from the seventh harmonic wave forming optical element 11. These light beams are caused to be incident on the eighth harmonic wave forming optical element (CLBO crystal) 12. Here, the fundamental wave of s-polarized light and the seventh harmonic wave of s-polarized light are overlapped, so that an eighth harmonic wave of p-polarized light is generated. In cases where it is desired to separate only the eighth harmonic wave from the light of other wavelengths emitted from the eighth harmonic wave forming optical element 12, these respective light beams can be separated by using a dichroic mirror, a polarizing beam splitter, or a prism.

Figure 10:
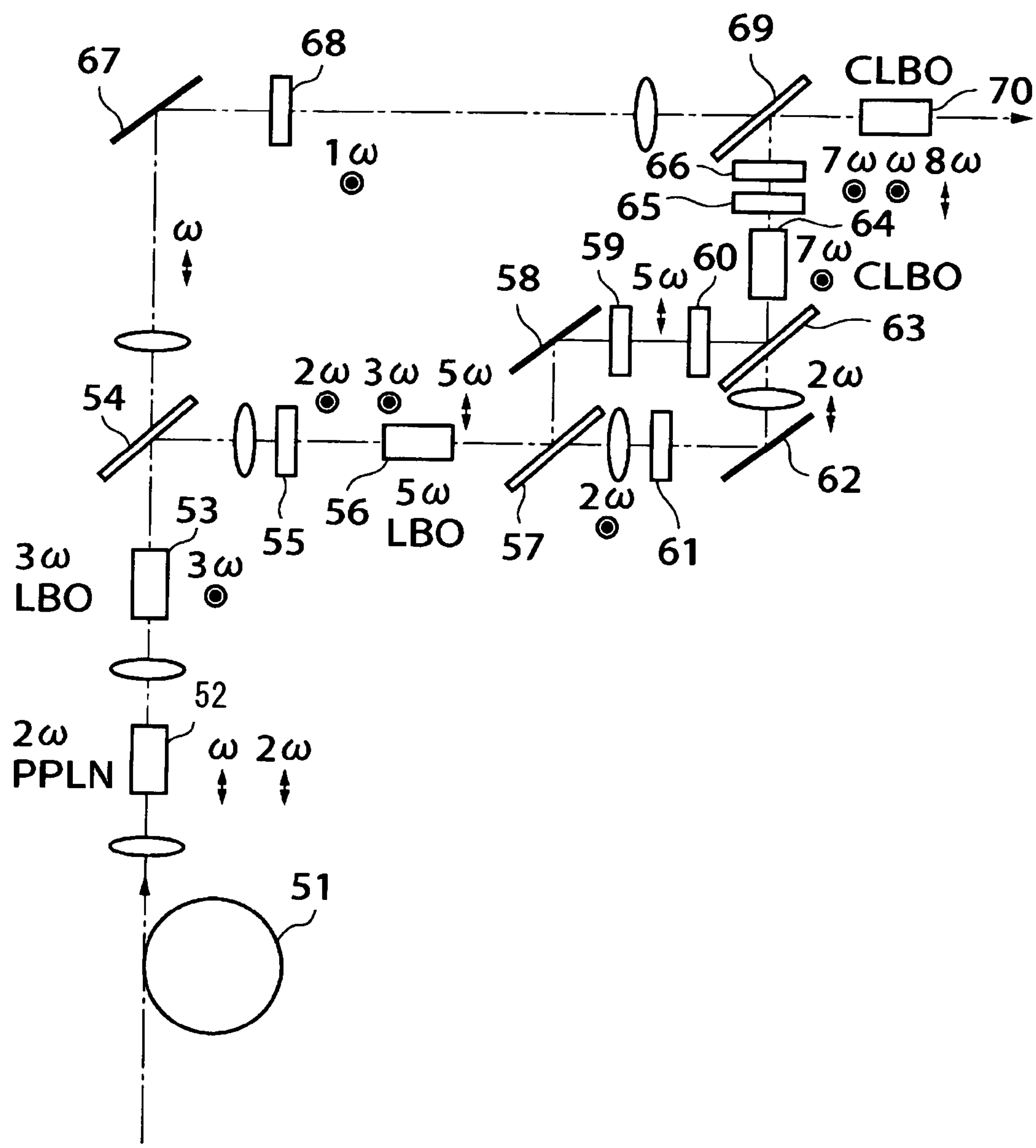
FIG. 10 is a diagram showing an outline of the optical system of a conventional laser apparatus.

As is seen by comparing FIGS. 10 and 1, the extremely characterizing feature of the present working configuration is that there is no cylindrical lens for walk-off correction between the seventh harmonic wave forming optical element 11 and the eighth harmonic wave forming optical element 12, so that the light emitted from the seventh harmonic wave forming optical element 11 is caused to be incident on the eighth harmonic wave forming optical element 12 "as is" (this is referred to as series connection between the seventh harmonic wave forming optical element 11 and eighth harmonic wave forming optical element 12).

The reason for this is as follows: namely, in cases where a CLBO crystal is used as the seventh harmonic wave forming optical element 11, the walk-off of the seventh harmonic wave is small compared to the case of using a BBO crystal; therefore, if the diameter of the beam that is incident on the seventh harmonic wave forming optical element 11 is increased, and the length of the seventh harmonic wave forming optical element 11 is reduced, then the cross-sectional shape of the seventh harmonic wave that is emitted from the seventh harmonic wave forming optical element 11 is not very far from a circle, so that even if this seventh harmonic wave is caused to be incident on the eighth harmonic wave forming optical element 12 "as is," a sufficient contribution to wavelength conversion is possible.

The confocal length of the beam is expressed by $b=2\pi\omega^2/\lambda$ (107 : beam radius). For example, if the beam diameter of the harmonic that is incident on the seventh harmonic wave forming optical element 11 is set as in Table 1 (approximately 200 to 300 μm), the confocal length (i.e., the length that can be deemed as substantially parallel light) can be made relatively long (approximately 90 mm to 280 mm). Accordingly, if the length of the seventh harmonic wave forming optical element 11 and eighth harmonic wave forming optical element 12 is set at approximately 5 mm, it is possible to dispose the eighth harmonic wave forming optical element 12 adjacent to the seventh harmonic wave forming optical element 11.

Figure 2:
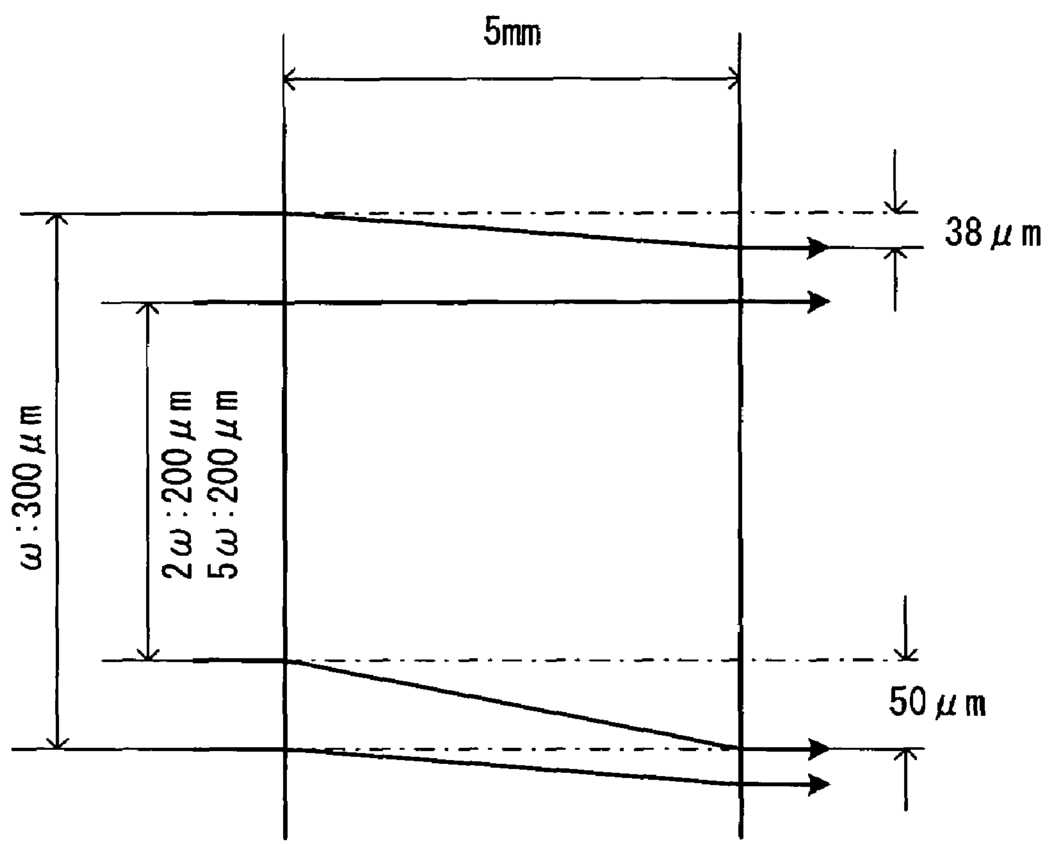
FIG. 2 is a diagram showing the conditions of walk-off generation of the fundamental wave and seventh harmonic wave in a CLBO crystal.

FIG. 2 shows the conditions of walk-off generation of the fundamental wave and seventh harmonic wave when the diameter of the fundamental wave that is incident on the seventh harmonic wave forming optical element 11 is 300 μm, and the diameter of the second harmonic wave and fifth harmonic wave is 200 μm. Furthermore, since walk-off is not generated in the p-polarized light in the CLBO crystal used for seventh harmonic wave generation, a depiction of these light beams is omitted (the wavelength of the fundamental wave is 1547 nm).

The walk-off of the fundamental wave increases as this wave advances through the CLBO crystal. However, since the walk-off is constant among all of the incident light, the cross-sectional shape of the incident light and emitted light is kept the same, and only the position of the optical axis varies. In cases where the length of the CLBO crystal is 5 mm, the amount of walk-off is 38 μm.

Meanwhile, a seventh harmonic wave is successively generated inside the CLBO crystal, and walk-off occurs following the generation. Accordingly, the amount of walk-off at the time of emission varies according to the generation position, and in cases where the length of the CLBO crystal is 5 mm, the amount of walk-off is 0 to 50 μm. However, even at maximum, the amount of walk-off is smaller than 200 μm, which is the diameter of the incident light. Furthermore, in this case, the diameter of the incident fundamental wave is set to be greater than the diameter of the second harmonic wave/fifth harmonic wave; therefore, the emitted fundamental wave and seventh harmonic wave overlap. Accordingly, even if such light is caused to be incident on the eighth harmonic wave forming optical element 12 "as is," wavelength conversion can be performed efficiently.

Table 1 shows the relationship between the beam diameter, confocal length and walk-off angle of the fundamental wave (wavelength: 1547 nm), second harmonic wave, fifth harmonic wave and seventh harmonic wave in the CLBO crystal.

TABLE 1

| | Beam Shape Inside 7ω CLBO Crystal | | |
|---|---|---|---|
| | Beam diameter | Confocal length | Walk-off |
| ω | 300 μm | 90 mm | 7.5 mrad |
| 2ω | 200 μm | 90 mm | 0 mrad |
| 5ω | 200 μm | 200 mm | 0 mrad |
| 7ω | 200 μm | 280 mm | 10 mrad |

In general, it is preferable to set the diameter of the light beam that is incident on the seventh harmonic wave forming optical element using a CLBO crystal at 100 to 300 μm. In cases where the diameter is less than 100 μm, the amount of walk-off becomes relatively large, so that the beam shape of the emitted light needs to be adjusted. On the other hand, if the diameter exceeds 300 μm, the beam convergence is insufficient, so that wavelength conversion cannot be performed efficiently. Similarly, it is preferable to set the length of the seventh harmonic wave forming optical element at 3 to 10 mm. If the length exceeds 10 mm, the amount of walk-off becomes relatively large, so that beam shaping of the emitted light must be performed. On the other hand, if the length is less than 3 mm, sufficient wavelength conversion cannot be performed.

As is seen from a comparison of FIGS. 10 and 1, the number of the optical elements is smaller in the construction shown in FIG. 1. Table 2 shows a comparison of the number of the main optical elements and the number of superimpositions of the light beams between the conventional construction shown in FIG. 10 and the new construction shown in FIG. 1. In the construction shown in FIG. 1, it would also be possible to use a construction in which the seventh harmonic wave forming optical element 11 and eighth harmonic wave forming optical element 12 are not connected directly in series, but a cylindrical lens or a lens (e.g., focal distance=30 to 50 mm) is inserted between the seventh harmonic wave forming optical element 11 and eighth harmonic wave forming optical element 12 in order to focus the fundamental wave and seventh harmonic wave on a specified position of the eighth harmonic wave forming optical element 12 and to correct axial deviation. Even if such a construction is taken, the number of the optical elements is still smaller in the new construction, and the number of superimpositions of the light beams is also smaller.

Furthermore, in the construction shown in FIG. 1, no dichroic mirror is used to combine the fundamental wave and seventh harmonic wave. Generally, in the case of deep ultraviolet light, there is a problem in that the dichroic mirror is damaged by the deep ultraviolet light, so that durability is poor. However, by eliminating the need for such a dichroic mirror, a laser apparatus with high durability as a whole can be obtained.

TABLE 2

| | Waveplate | Dichroic mirror | Lens | Cylindrical lens | Mirror | Superimposition |
|---|---|---|---|---|---|---|
| Conventional construction | 3 | 4 | 7 | 4 | 3 | 2 |
| New construction | 1 | 1 | 6 | 2 | (1) | 1 |

In the optical system shown in FIG. 1(*a*), it is desirable that the dichroic mirror 10 be replaced by an element of the type shown in FIG. 1(*b*) or 1(*c*) from the standpoint of improving durability. The dichroic mirror 10 shown in FIG. 1(*a*) allows the fifth harmonic wave to pass through, and reflects the fundamental wave and second harmonic wave. The dichroic prism (cube type of dichroic mirror) 21 shown in FIG. 1(*b*), on the other hand, reflects the fifth harmonic wave, and allows the fundamental wave and second harmonic wave to pass through. In FIG. 1(*c*), a dichroic mirror 22 that reflects the fifth harmonic wave and allows the fundamental wave and second harmonic wave to pass through and a parallel plate for dispersion compensation 23 on the optical path of the fundamental wave and second harmonic wave are disposed. The parallel plate for dispersion compensation 23 is a plate which compensates for the shift of the optical axis that occurs when the fundamental wave and second harmonic wave pass through the dichroic mirror 22.

Figure 11:
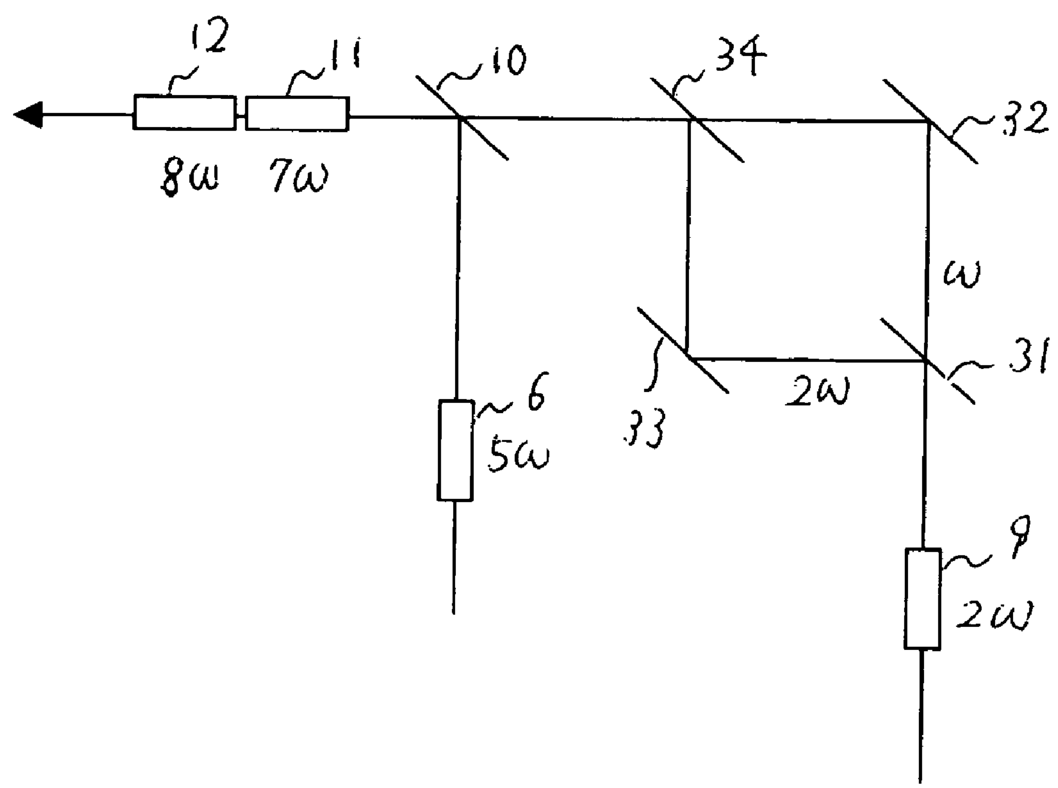
FIG. 11 is a diagram showing an outline of the optical system of a laser apparatus constituting modified working configuration of the present invention.

Furthermore, it is possible to modify the configuration from the second EDFA amplifier 2 to the dichroic mirror 10 as shown in FIG. 11 remaining the configuration from the first EDFA amplifier 1 to the dichroic mirror 10 as shown in FIG. 1. Namely, the fundamental wave emitted from the second harmonic wave forming optical element 9 is separated from the p-polarized second harmonic wave by the dichroic mirror 31 (the fundamental wave is passed and the second harmonic wave is reflected), and they are combined by the dichroic mirror 34 via mirror 32, 33 and lenses that are not illustrated. And the fundamental wave, the second harmonic wave and the fifth harmonic wave are combined by the dichroic mirror 10. By this configuration, the position and size of beam-waist of the second harmonic wave in the seventh harmonic wave forming optical element 11 and the position and size of beam-waist of the fundamental wave in the eighth harmonic wave forming optical element 12 can be adjusted independently.

In FIG. 1, if the beam adjustment is performed so that the beam waist of the second harmonic wave is located in the center of the seventh harmonic wave forming optical element 11, and so that the beam waist of the fundamental wave is located in the center of the eighth harmonic wave forming optical element 12, then an eighth harmonic wave can be generated at a high conversion efficiency.

As is shown in FIG. 1, the fundamental wave and second harmonic wave propagate on the same axis following the dichroic mirror 10. However, since the refractive indices are different between the fundamental wave and second harmonic wave, the positional relationship described above can be realized by inserting two lenses consisting of different materials between the dichroic mirror 10 and seventh harmonic wave forming optical element 11, and adjusting the thickness, position and surface curvature of these lenses. These two lenses may also be optimized and joined or bonded. In addition, instead of using two lenses consisting of different materials, two plano-convex lenses consisting of the same material or the like may also be used. However, in order to ensure the degree of freedom, the use of two lenses consisting of different materials is preferable.

Furthermore, the combination of the polarization (p wave, s wave) of the light that is incident on the respective wavelength converting optical elements such as the second harmonic wave forming optical element is not limited to the combination shown in the first working configuration. In concrete terms, examples that may be cited as the polarized light incident on the first second harmonic wave forming optical element 3, the polarized light emitted from the second harmonic wave forming optical element 3, the polarized light incident on the second harmonic wave forming optical element 9, and the polarized light emitted from the second harmonic wave forming optical element 9 are as follows:

[Incidence]→[Emission]: [P(1ω)]→[P(2ω)], [P(1ω)]→[S(2ω)],
[S(1ω)]→[P(2ω)], [S(1ω)]→[S(2ω)]

(for example, the second harmonic wave of p-polarized light is marked as P(2ω)). Moreover, examples that may be cited as the polarized light incident on the third harmonic wave forming optical element 4 and the polarized light emitted from the third harmonic wave forming optical element 4 are as follows:

[Incidence]→[Emission]: [P(1ω)]+[P(2ω)]→[P(3ω)],
[P(1ω)]+[P(2ω)]→[S(3ω)],
[S(1ω)]+[P(2ω)]→[P(3ω)],
[S(1ω)]+[P(2ω)]→[S(3ω)],
[P(1ω)]+[S(2ω)]→[P(3ω)],
[P(1ω)]+[S(2ω)]→[S(3ω)],
[S(1ω)]+[S(2ω)]→[P(3ω)],
[S(1ω)]+[S(2ω)]→[S(3ω)]

Furthermore, examples that may be cited as the polarized light incident on the fifth harmonic wave forming optical element 6 and the polarized light emitted from the fifth harmonic wave forming optical element 6 are as follows:

[Incidence]→[Emission]: [P(2ω)]+[P(3ω)]→[P(5ω)],
[P(2ω)]+[P(3ω)]→[S(5ω)],
[S(2ω)]+[P(3ω)]→[P(5ω)],
[S(2ω)]+[P(3ω)]→[S(5ω)],
[P(2ω)]+[S(3ω)]→[P(5ω)],
[P(2ω)]+[S(3ω)]→[S(5ω)],
[S(2ω)]+[S(3ω)]→[P(5ω)],
[S(2ω)]+[S(3ω)]→[S(5ω)]

However, among these conditions of polarization between the incident light and emitted light, there are conditions that cannot be established solely by the respective harmonic wave forming optical elements. In such cases, the conditions can be created by inserting a waveplate (polarization control element) as needed on the side of the incidence or on the side of the emission of a harmonic wave forming optical element. Accordingly, such conditions are also cited in the relational expressions described above as the polarization conditions between the light incident on the respective harmonic wave forming optical elements and the light emitted from the respective harmonic wave forming optical elements.

Figure 3:
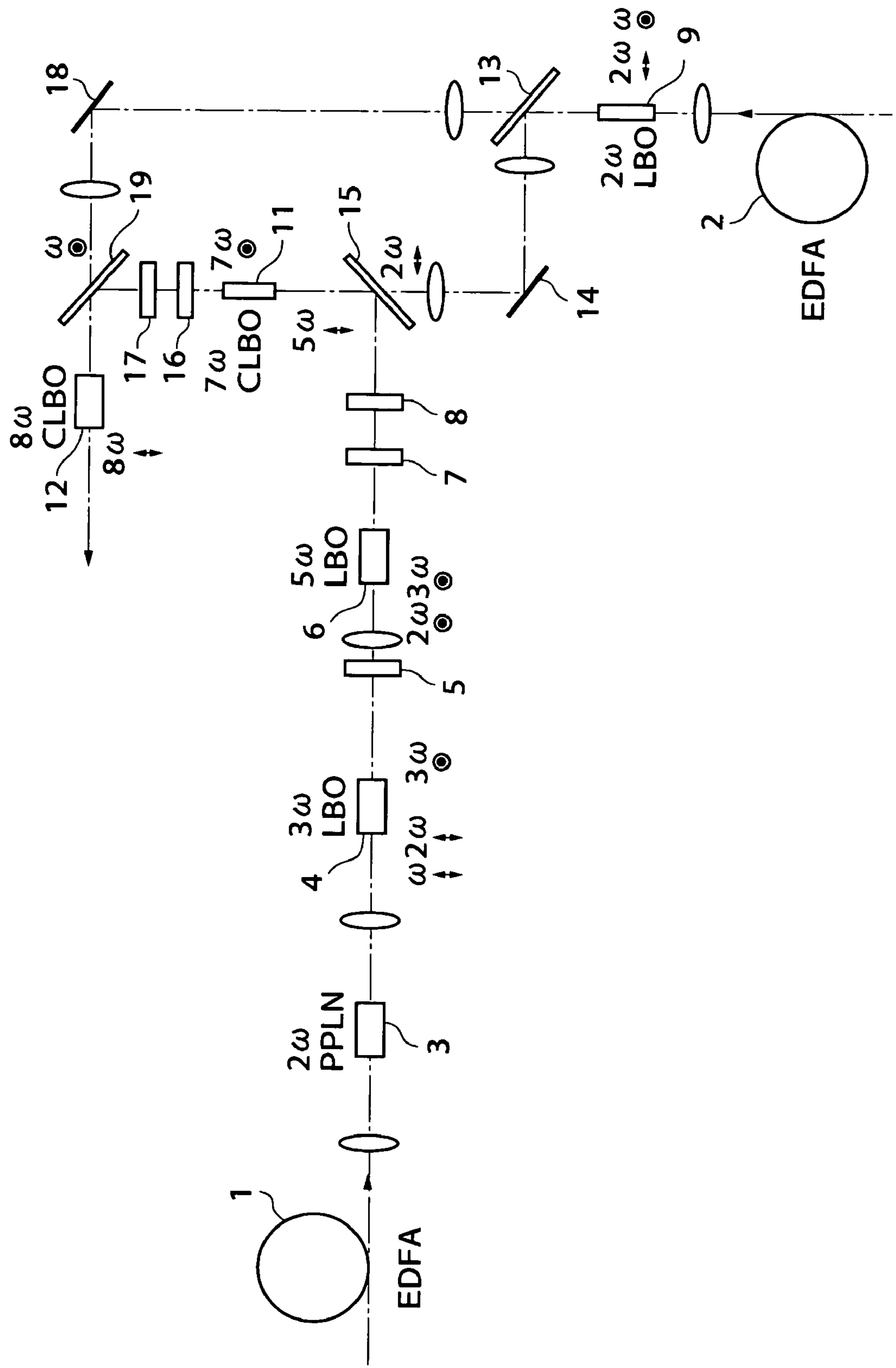
FIG. 3 is a diagram showing an outline of the optical system of a laser apparatus constituting a second working configuration of the present invention.
Figure 4:
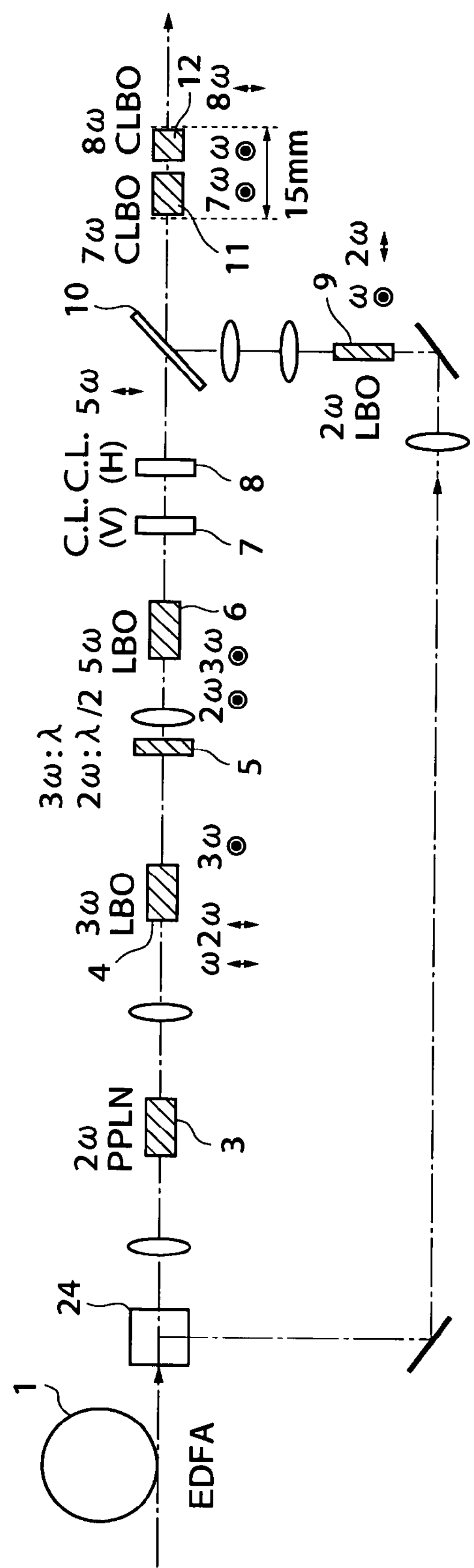
FIG. 4 is a diagram showing an outline of the optical system of a laser apparatus constituting a third working configuration of the present invention.
Figure 5:
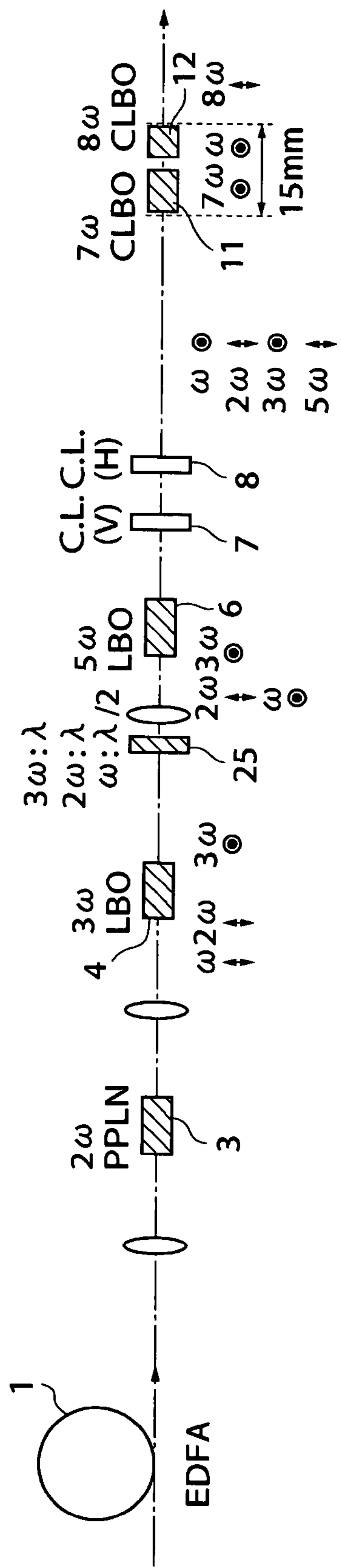
FIG. 5 is a diagram showing an outline of the optical system of a laser apparatus constituting a fourth working configuration of the present invention.

The combination of polarization of light incident on these respective harmonic wave forming optical elements and the polarization of light emitted from the respective harmonic wave forming optical elements can be appropriately selected FIG. 3 is a diagram showing an outline of the optical system of a laser apparatus constituting a second working configuration of the present invention. Portions of the constructions shown in FIGS. 3, 4 and 5 are shared with the construction shown in FIG. 1. Accordingly, the same constituent elements are labeled with the same symbols, and a description of these elements is omitted. Furthermore, it is a universally known fact that a portion of the light that is incident on a wavelength converting crystal is used for wavelength conversion, while the other portion passes through this wavelength converting crystal “as is.” Accordingly, such light that passes through “as is” may be omitted from the following description.

In FIG. 3, the optical system that generates a fifth harmonic wave of p-polarized light from the fundamental wave of p-polarized light is the same as the optical systems shown in FIG. 1, and the optical system that generates a second harmonic wave of p-polarized light from the fundamental wave of s-polarized light is also the same as the optical systems shown in FIG. 1, except that there is no mirror M.

In the optical systems shown in FIG. 3, the emitted light from the second second harmonic wave forming optical element 9 is separated into a fundamental wave and a second harmonic wave by a dichroic mirror 13. The separated second harmonic wave is combined by a dichroic mirror 15 via a mirror 14 with the fifth harmonic wave that is generated by the fifth harmonic wave forming optical element 6 and that is subjected to beam shaping by the cylindrical lenses 7 and 8, and is then caused to be incident on the seventh harmonic wave forming optical element 11. In this example, the deformation of the cross-sectional shape of the emitted light caused by the walk-off of the seventh harmonic wave in the seventh harmonic wave forming optical element 11 is corrected by installing cylindrical lenses 16 and 17 following the seventh harmonic wave forming optical element 11.

The fundamental wave that is separated by the dichroic mirror 13 is combined by a dichroic mirror 19 via a mirror 18 with the seventh harmonic wave that is subjected to beam shaping by the cylindrical lenses 16 and 17, and is then caused to be incident on the eighth harmonic wave forming optical element 12. As a result, an eighth harmonic wave is generated from the eighth harmonic wave forming optical element 12.

FIG. 4 is a diagram showing an outline of the optical system of a laser apparatus constituting a third working configuration of the present invention. This working configuration differs from the first working configuration only in the following regard, and the remaining construction is the same as in the first working configuration: specifically, the second EDFA 2 in the first working configuration shown in FIG. 1 is not used, and the laser light emitted from the first EDFA 1 is separated into a p-polarized component and an s-polarized component by a polarizing beam splitter 24; the p-polarized component is caused to be incident on the second harmonic wave forming optical element 3, while the s-polarized component is caused to be incident on the second harmonic wave forming optical element 9.

Although this is omitted from the depiction, a λ/2 plate used to adjust the ratio of the p-polarized component and s-polarized component is installed in front of the polarizing beam splitter. If this is done, the output of the eighth harmonic wave is smaller than in the case of the first working configuration; however, only one EDFA is sufficient, so that the construction is simplified.

The separation between the p-polarized component and s-polarized component can be accomplished using a beam sampler, beam splitter, diffraction optical element, or the like.

FIG. 5 is a diagram showing an outline of the optical system of a laser apparatus constituting a fourth working configuration of the present invention.

In the present working configuration, an eighth harmonic wave is generated by a simpler construction than in the first, second and third working configurations. The construction of this optical system is the same as in the first working configuration up to the third harmonic wave forming optical element 4.

With regard to the light emitted from the third harmonic wave forming optical element 4, only the fundamental wave is converted into s-polarized light by passing through a 3-wavelength waveplate 25; the second harmonic wave remains as p-polarized light, and the third harmonic wave remains as s-polarized light. As was described above, for example, a waveplate consisting of a flat plate of a uniaxial crystal that is cut parallel to the optical axis of the crystal is used as the 3-wavelength waveplate. The thickness of the waveplate (crystal) is cut at an integral multiple of $\lambda/2$ with respect to the light of one wavelength (fundamental wave), and is cut at an integral multiple of $\lambda$ with respect to the light of the remaining wavelengths, so that the polarization is rotated with respect to the light of one wavelength, and so that the polarization is not rotated with respect to the light of the remaining wavelengths. These light beams are caused to be incident on the fifth harmonic wave forming optical element 6. In this case, a CLBO crystal is used as the fifth harmonic wave forming optical element.

Among the light that is emitted from the fifth harmonic wave forming optical element 6, the fundamental wave is s-polarized light, the second harmonic wave is p-polarized light, the third harmonic wave is s-polarized light, and the fifth harmonic wave is p-polarized light. These light beams are caused to be incident on the seventh harmonic wave forming optical element (CLBO crystal) 11 after the beam profile is shaped into a circular shape by the cylindrical lenses 7 and 8, and the second harmonic wave and fifth harmonic wave are combined, so that a seventh harmonic wave of s-polarized light is generated. Then, this seventh harmonic wave and the fundamental wave of s-polarized light are combined by the eighth harmonic wave forming optical element (CLBO crystal) 12, so that an eighth harmonic wave is generated.

Table 3 shows the intensity ratio of the respective harmonic wave components in the working configuration shown in FIG. 4, and Table 4 shows the intensity ratio of the respective harmonic wave components in the working configuration shown in FIG. 5. In these tables, NLC indicates the order of the harmonic wave forming optical elements; 1 indicates the second harmonic wave forming optical element, 2 indicates the third harmonic wave forming optical element, 3 indicates the fifth harmonic wave forming optical element, 4 indicates the seventh harmonic wave forming optical element, and 5 indicates the eighth harmonic wave forming optical element.

In the working configuration shown in FIG. 4, the efficiency is the highest when the wave separation is performed with a ratio which is such that the fundamental wave of p-polarized light is 0.6, and the fundamental wave of s-polarized light is 0.4. Accordingly, data with such a ratio is shown. The constructions of the seventh harmonic wave forming optical element and eighth harmonic wave forming optical element are the same between the working configuration shown in FIG. 4 and the working configuration shown in FIG. 5, so that a comparison is meaningless; therefore, a description is omitted.

From the seventh harmonic wave forming optical element on, the waves that are used to generate an eighth harmonic wave are the fundamental wave, second harmonic wave and fifth harmonic wave. Therefore, if Table 3 and Table 4 are viewed by focusing these waves, it is seen that only 60% of all the light is converted into these harmonic waves in the working configuration shown in FIG. 4 (Table 3), while 90% or more of all the light is converted into these harmonic waves in the working configuration shown in FIG. 5 (Table 4). Accordingly, if only the effective utilization efficiency of the light up to the fifth harmonic wave formation is considered, it can be said that the working configuration shown in Table 5 is superior.

TABLE 3

| NLC | | 1 | | | 2 | | | 3 | | | 4 | | | 5 | | |
|---|---|---|---|---|---|---|---|---|---|---|---|---|---|---|---|---|
| 1 ω | 0.6 | | 1 ω | 0.24 | | 1 ω | 0.18 | | 1 ω | 0.16 | | 1 ω | - | | 1 ω | - |
| | | | 2 ω | 0.36 | | 2 ω | 0.27 | | 2 ω | 0.24 | | 2 ω | - | | 2 ω | - |
| | | | | | | 3 ω | 0.15 | | 3 ω | 0.04 | | 3 ω | - | | 3 ω | - |
| | | | | | | | | | 5 ω | 0.18 | | 5 ω | - | | 5 ω | - |
| | | | | | | | | | | | | 7 ω | - | | 7 ω | - |
| | | | | | | | | | | | | | | | 8 ω | - |
| 1 ω | 0.4 | | 1 ω | 0.16 | | | | | | | | | | | | |
| | | | 2 ω | 0.24 | | | | | | | | | | | | |

TABLE 4

| NLC | | 1 | | | 2 | | | 3 | | | 4 | | | 5 | | |
|---|---|---|---|---|---|---|---|---|---|---|---|---|---|---|---|---|
| 1 ω | 1 | | 1 ω | 0.4 | | 1 ω | 0.3 | | 1 ω | 0.3 | | 1 ω | - | | 1 ω | - |
| | | | 2 ω | 0.6 | | 2 ω | 0.45 | | 2 ω | 0.33 | | 2 ω | - | | 2 ω | - |
| | | | | | | 3 ω | 0.25 | | 3 ω | 0.07 | | 3 ω | - | | 3 ω | - |
| | | | | | | | | | 5 ω | 0.3 | | 5 ω | - | | 5 ω | - |
| | | | | | | | | | | | | 7 ω | - | | 7 ω | - |
| | | | | | | | | | | | | | | | 8 ω | - |

Furthermore, in the working configurations described above, two cylindrical lenses are used with their axes perpendicular to each other in order to correct the deformation of the beam caused by walk-off. The use of cylindrical lenses has the advantage of easy adjustment; however, it would also be possible to use other lenses such as elliptical lenses for the purpose of correcting the beam deformation.

Moreover, the combination of the polarization (p wave, s wave) of the light that is incident on the respective wavelength converting optical elements is not limited to the combination shown in the fourth working configuration. In concrete terms, examples that may be cited as the polarized light incident on the second harmonic wave forming optical element 3 and the polarized light emitted from the second harmonic wave forming optical element 3 are as follows:

[Incidence]→[Emission]: [P(1ω)]→[P(2ω)], [P(1ω)]→[S(2ω)],
[S(1ω)]→[P(2ω)], [S(1ω)]→[S(2ω)]

(for example, the second harmonic wave of p-polarized light is marked as P(2ω)). Moreover, examples that may be cited as the polarized light incident on the third harmonic wave forming optical element 4 and the polarized light emitted from the third harmonic wave forming optical element 4 are as follows:

[Incidence]→[Emission]: [P(1ω)]+[P(2ω)]→[P(3ω)],
[P(1ω)]+[P(2ω)]→[S(3ω)],
[S(1ω)]+[P(2ω)]→[P(3ω)],
[S(1ω)]+[P(2ω)]→[S(3ω)],
[P(1ω)]+[S(2ω)]→[P(3ω)],
[P(1ω)]+[S(2ω)]→[S(3ω)],
[S(1ω)]+[S(2ω)]→[P(3ω)],
[S(1ω)]+[S(2ω)]→[S(3ω)]

Furthermore, examples that may be cited as the polarized light incident on the fifth harmonic wave forming optical element 6 and the polarized light emitted from the fifth harmonic wave forming optical element 6 are as follows:

[Incidence]→[Emission]: [P(2ω)]+[P(3ω)]→[P(5ω)],
[P(2ω)]+[P(3ω)]→[S(5ω)],
[S(2ω)]+[P(3ω)]→[P(5ω)],
[S(2ω)]+[P(3ω)]→[S(5ω)],
[P(2ω)]+[S(3ω)]→[P(5ω)],
[P(2ω)]+[S(3ω)]→[S(5ω)],
[S(2ω)]+[S(3ω)]→[P(5ω)]

With regard to the state of polarization prior to the seventh harmonic wave forming optical element 11, the polarization of the fundamental wave and seventh harmonic wave must coincide in the case of the series connection with the eighth harmonic wave forming optical element 12. Accordingly, [(1ω), (2ω), (3ω), (5ω)]=[S, P, P, P], [S, P, S, P], [P, S, P, S], [P, S, S, S] may be cited. However, among these conditions of polarization between the incident light and emitted light, there are conditions that cannot be established solely by the respective harmonic wave forming optical elements. In such cases, the conditions can be created by inserting a waveplate (polarization control element) as needed on the side of the incidence or on the side of the emission of a harmonic wave forming optical element. Accordingly, such conditions are also cited in the relational expressions described above as the polarization conditions between the light incident on the respective harmonic wave forming optical elements and the light emitted from the respective harmonic wave forming optical elements.

The combination of polarization of light incident on these respective harmonic wave forming optical elements and the polarization of light emitted from the respective harmonic wave forming optical elements can be appropriately selected.

Next, an exposure apparatus 100 which is used in a photolithographic process (one type of semiconductor manufacturing process) and is constructed using a laser apparatus 20 constituting the working configuration of the present invention described above will be described with reference to FIG. 6. The exposure apparatus used in a photolithographic process is in principle identical to that used in photoengraving. A device pattern which is finely drawn on a photo-mask (reticle) is transferred by being optically projected onto a semiconductor wafer, glass substrate, or the like which is coated with a photo-resist. This exposure apparatus 100 is constructed so that this apparatus comprises the laser apparatus 20 described above, an illumination optical system 102, a mask supporting stand 103 which supports a photo-mask (reticle) 110, a projection optical system 104, a carrying stand 105 which carries and holds a semiconductor wafer 115 constituting the object of exposure, and a driving device 106 which moves the carrying stand 105 horizontally.

In this exposure apparatus 100, the laser light which is output from the laser apparatus 20 is input into the illumination optical system 102 that is constructed from a plurality of lenses, and is caused to irradiate the entire surface of the photo-mask 110 supported on the mask supporting stand 103 via this illumination optical system 102. The light that passes through the photo-mask 110 as a result of this irradiation has an image of the device pattern that is drawn on the photo-mask 110. Via the projection optical system 104, this light is caused to irradiate specified positions on the semiconductor wafer 115 that is carried on the carrying stand 105. In this case, an image of the device pattern on the photo-mask 110 is reduced and focused as an exposing light image on the surface of the semiconductor wafer 115 by the projection optical system 104. In the case of the exposure apparatus described above, an exposure apparatus which is compact and has good maintenance characteristics and operating characteristics can be obtained by utilizing the characteristics of an ultraviolet light source that is compact and light-weight, and has a high degree of freedom in its layout.

Figure 7:
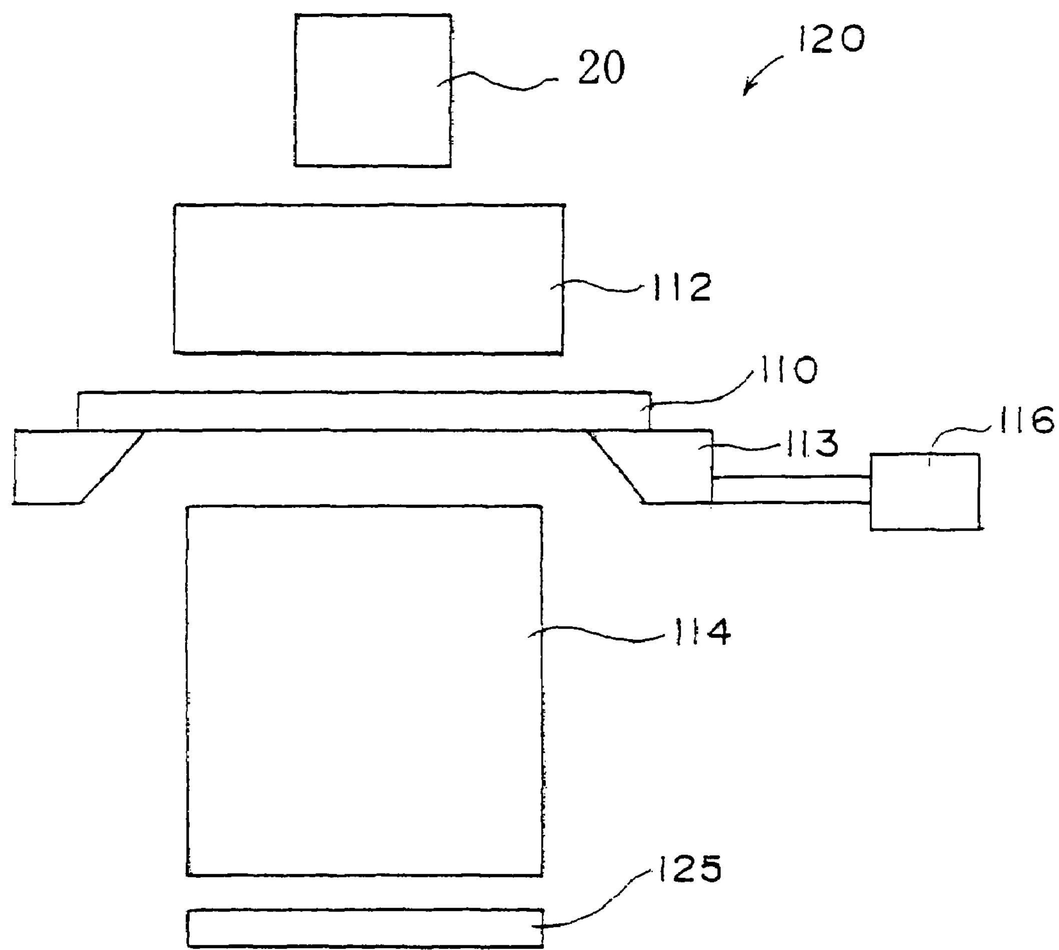
FIG. 7 is a diagram showing an outline of a mask defect inspection device using a laser apparatus constituting a working configuration of the present invention.

Next, a mask defect inspection device constructed using the laser apparatus 20 of the present invention described above will be described with reference to FIG. 7. A mask defect inspection device optically projects a device pattern that is precisely drawn on a photo-mask onto a TDI sensor (time delay and integration sensor), compares the sensor image with a specified reference image, and extracts pattern defects from the differences. The mask defect inspection device 120 is constructed so that this device comprises the laser apparatus 20 described above, an illumination optical system 112, a mask supporting stand 113 that supports a photo-mask 110, a driving device 116 that causes the mask supporting stand to move horizontally, a projection optical system 114, and a TDI sensor 125. In this mask defect inspection device 120, the laser light that is output from the laser apparatus 20 is input into the illumination optical system 112 that is constructed from a plurality of lenses, and a specified region on the photo-mask 110 that is supported on the mask supporting stand 113 is irradiated via this illumination optical system. The light that passes through the photo-mask 110 as a result of this irradiation has an image of the device pattern that is drawn on the photo-mask 110, and this light is focused in a specified position on the TDI sensor 125 via the projection optical system 114. Furthermore, the horizontal movement speed of the mask supporting stand 113 and the transmission clock of the TDI sensor 125 are synchronized.

Figure 8:
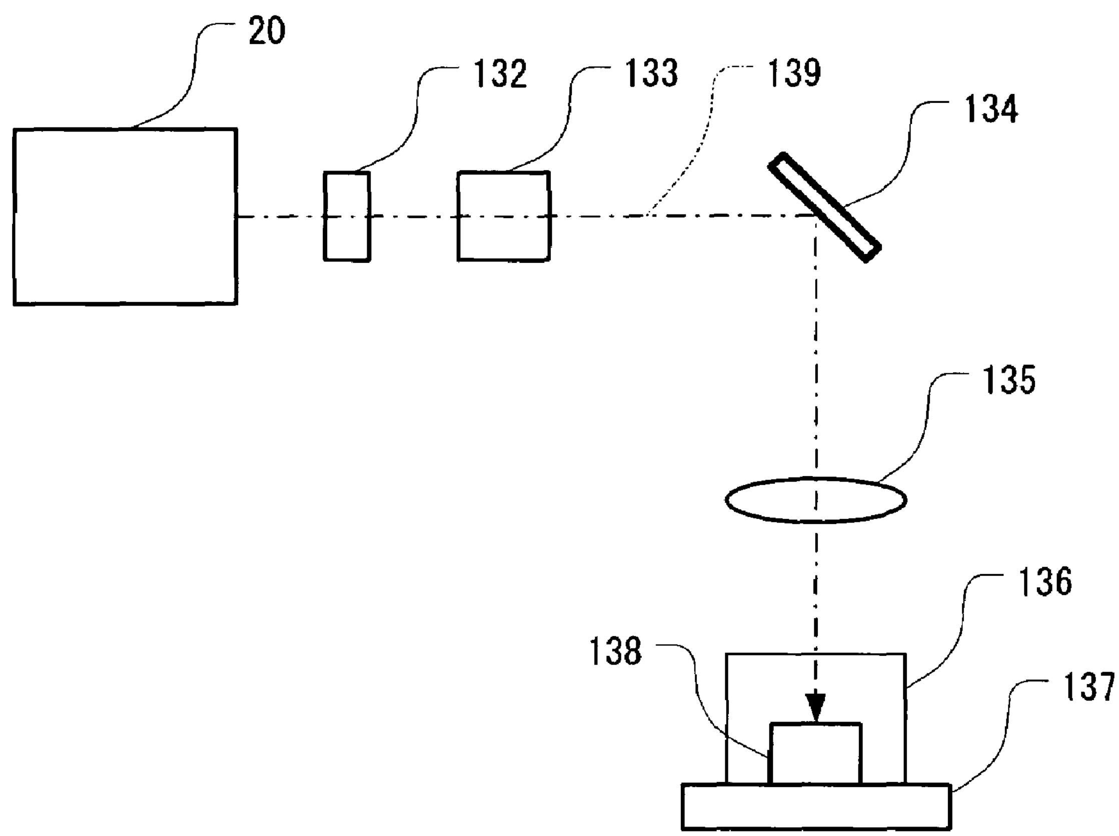
FIG. 8 is a diagram showing an outline of a polymer crystal working apparatus using a laser apparatus constituting a working configuration of the present invention.

FIG. 8 is a schematic diagram of a polymer crystal working apparatus constructed using the laser apparatus 20 of the present invention. The ultraviolet short-pulse laser light 139 emitted from the laser apparatus 20 is focused and directed onto a polymer crystal 138 placed in a sample container 136 via a shutter 132, intensity adjusting element 133, irradiation position control mechanism 134, and focusing optical system 135. The sample container 136 is carried on a stage 137, and can move in the directions of three dimensions along the x axis, y axis and z axis in an x-y-z orthogonal coordinate system with the direction of the optical axis taken as the z axis; furthermore, the container can rotate about the z axis. Working of the polymer crystal 138 is accomplished by the laser light that is focused and directed onto the surface of the polymer crystal.

In cases where a polymer crystal is worked, it is necessary to confirm the location on the object of working that is irradiated by the laser light. However, laser light is ordinarily not visible light, so that confirmation by visual inspection is impossible. Accordingly, it is desirable that this apparatus be used in combination with an optical microscope.

Figure 9:
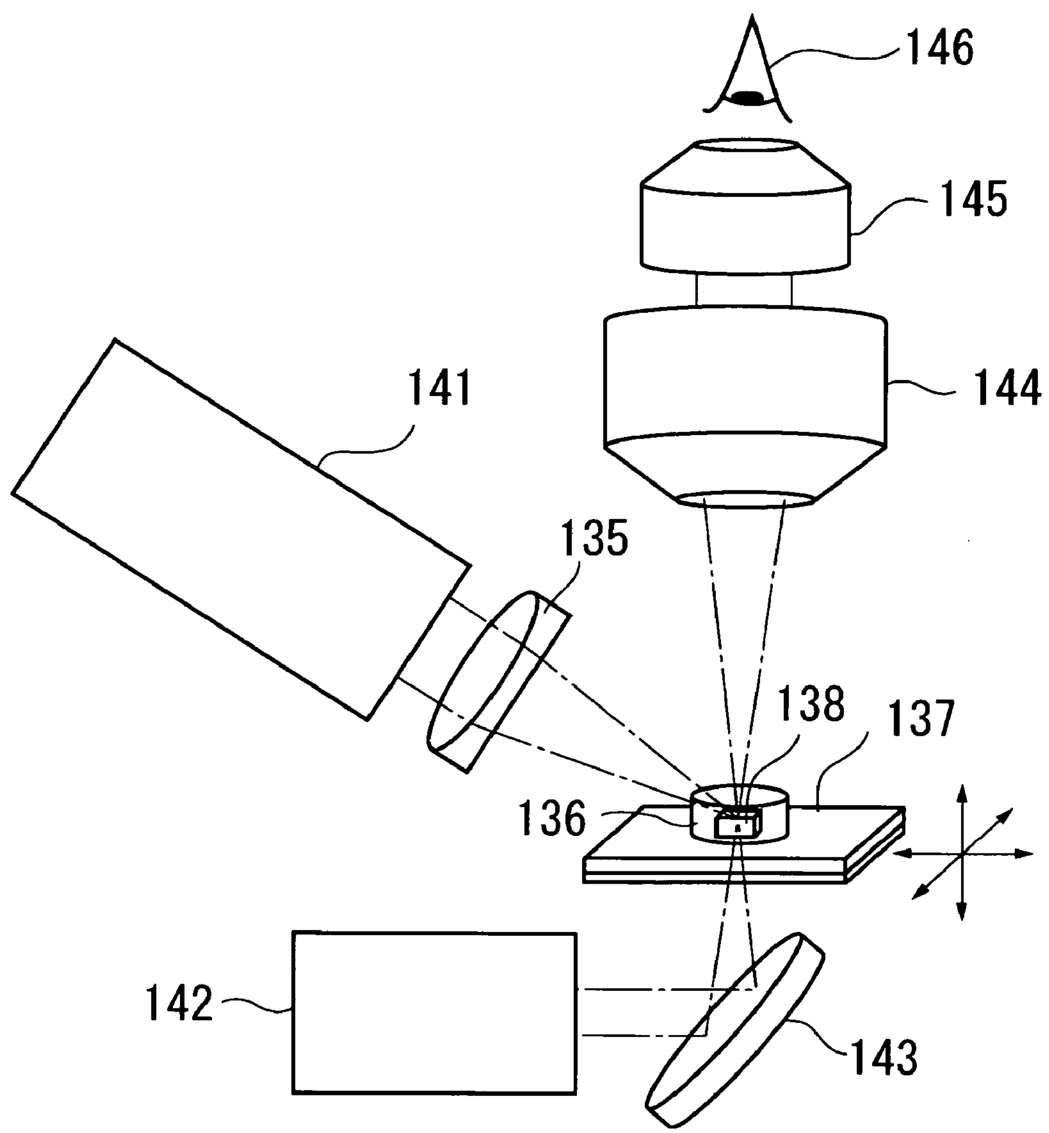
FIG. 9 is a diagram showing an example in which a polymer crystal working apparatus using a laser apparatus constituting a working configuration of the present invention is used in combination with an optical microscope.

An example is shown in FIG. 9. In the optical system shown in FIG. 9, laser light from an ultraviolet short-pulse laser system 141 (corresponding to symbols 20 and 132 through 134 in FIG. 8) is focused on a specified point via a focusing optical system 135. The stage 137 has the function described in FIG. 8; a sample container 136 containing a polymer crystal 138 is carried on the stage 137. Visible light from an illuminating light source 142 is reflected by a reflective mirror 143, and subjects the sample container 136 to Koehler illumination. The polymer crystal 138 is viewed by the eye 146 via the object lens 144 and ocular lens 145 of the optical microscope.

A cruciform mark is formed in the position of the optical axis of the optical microscope, so that the optical axis position can be recognized visually. Furthermore, the position of the focal point of the optical microscope (focus position, i.e., the plane that is in focus when viewed visually) is fixed. The laser light that is focused by the focusing optical system 135 is focused in the position of the optical axis of the optical microscope, and in the position of the focal point of the optical microscope. Accordingly, in a case where the object of working is placed on the stage 137, and an image of this object of working is observed with the optical microscope, the image is focused, and the laser light from the laser system 141 is focused in the position located at the center of the cruciform mark. Furthermore, the relative positional relationship of the laser system 141, focusing optical system 135 and optical microscope parts is fixed, so that only the stage 137 can move relative to these fixed systems.

Accordingly, by performing working while moving the stage 137 so that the location where working is to be performed is located in the optical axis position and focal position of the optical microscope, working of desired locations and working of desired shapes can be accomplished. If it is desired to perform automated working, this can be accomplished by attaching an automatic focal point adjustment device to the optical microscope, driving the stage 137 in accordance with instructions from this device, and driving the stage 137 so that a predetermined specified part of the stage 137 is on the optical axis of the optical microscope. Furthermore, after the reference position is initially aligned, the stage 137 may also be driven in two dimensions or in three dimensions by a servo mechanism.

With regard to laser treatment devices using the laser apparatus of the present invention, only the laser apparatus is different; the well known technique can be used "as is." Accordingly, a description is omitted.

The invention claimed is:

1. A wavelength converting optical system comprising:

a first second harmonic wave forming optical element which forms a first second harmonic wave from a first fundamental wave;

a third harmonic wave forming optical element which forms a third harmonic wave from the first fundamental wave and the first second harmonic wave that are emitted from the first second harmonic wave forming optical element;

a fifth harmonic wave forming optical element which forms a fifth harmonic wave from the first second harmonic wave and the third harmonic wave that are emitted from the third harmonic wave forming optical element;

a second harmonic wave forming optical element which forms a second harmonic wave from a second fundamental wave;

an optical member which combines on the same optical path the second fundamental wave and the second harmonic wave that are emitted from the second harmonic wave forming optical element with the fifth harmonic wave that is emitted from the fifth harmonic wave forming optical element;

a seventh harmonic wave forming optical element which forms a seventh harmonic wave from the second harmonic wave and the fifth harmonic wave; and an eighth harmonic wave forming optical element which forms an eighth harmonic wave from the second fundamental wave and the seventh harmonic wave that are emitted from the seventh harmonic wave forming optical element.

2. A wavelength converting optical system comprising:

a first wavelength converting optical system which forms a fifth harmonic wave from a first fundamental wave via at least one wavelength converting optical element;

a second harmonic wave forming optical element which forms a second harmonic wave from a second fundamental wave;

an optical member which combines on the same optical path the second fundamental wave and the second harmonic wave that are emitted from the second harmonic wave forming optical element with the fifth harmonic wave that is emitted from the first wavelength converting optical system;

a seventh harmonic wave forming optical element which forms a seventh harmonic wave from the second harmonic wave and the fifth harmonic wave; and an eighth harmonic wave forming optical element which forms an eighth harmonic wave from the second fundamental wave and the seventh harmonic wave that are emitted from the seventh harmonic wave forming optical element.

3. The wavelength converting optical system according to claim 1, further comprising:

another optical member which splits a fundamental wave into the first fundamental wave and the second fundamental wave.

4. The wavelength converting optical system according to any one of claims 1 through 3, wherein a length of the seventh harmonic wave forming optical element is 3 to 10 mm, and a beam diameter of the light that is incident on the seventh harmonic wave forming optical element is 100 to 300 μm.

5. The wavelength converting optical system according to claim 4, wherein there is no focusing optical system between the seventh harmonic wave forming optical element and the eighth harmonic wave forming optical element.

6. A laser light source comprising:

a laser light source generating a fundamental wave; and the wavelength converting optical system according any one of claims 1 through 3.

7. An exposure apparatus comprising:

the laser light source according to claim 6;

a mask supporting part which holds a photo-mask on which a specified exposure pattern is formed;

an object holding part which holds an object of exposure;

an illumination optical system which illuminates the photo-mask held by the mask supporting part with ultraviolet light emitted from the laser light source; and a projection optical system which illuminates the object of exposure held by the object holding part with illuminating light that is caused to illuminate the photo-mask via the illumination optical system and that passes through the photo-mask.

8. A mask defect inspection device comprising:

the laser light source according to claim 6;

a mask supporting part which holds a photo-mask on which a specified pattern is formed;

a detector which detects a projected image of the pattern;

an illumination optical system which illuminates the photo-mask held by the mask supporting part with ultraviolet light emitted from the laser light source; and a projection optical system which projects onto the detector illuminating light that has been caused to illuminate the photo-mask via the illumination optical system and that has passed through the photo-mask.

9. A polymer crystal working apparatus for working polymer crystals, comprising:

the laser light source according to claim 6;

an optical system which conducts laser light emitted from the laser light source to a polymer crystal that constitutes an object of working, and which focuses the laser light on a portion of the polymer crystal that is being worked; and a mechanism which varies relative positions of the optical system and the polymer crystal.

10. A wavelength converting optical system comprising:

a first wavelength converting optical system which forms a fifth harmonic wave from a first fundamental wave via at least one wavelength converting optical element;

a second harmonic wave forming optical element which forms a second harmonic wave from a second fundamental wave; and an optical member which combines on the same optical path the second fundamental wave and the second harmonic wave that are emitted from the second harmonic wave forming optical element with the fifth harmonic wave that is emitted from the first wavelength converting optical system.

11. The wavelength converting optical system according to claim 10, wherein the fifth harmonic wave, the second fundamental wave and the second harmonic wave are emitted from the optical member.

* * * * *